(12) United States Patent
Wu et al.

(10) Patent No.: US 7,168,033 B1
(45) Date of Patent: *Jan. 23, 2007

(54) PARITY CHECK MATRIX AND METHOD OF FORMING THEREOF

(75) Inventors: Zining Wu, Los Altos, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/281,400

(22) Filed: Nov. 18, 2005

Related U.S. Application Data

(63) Continuation of application No. 09/730,598, filed on Dec. 7, 2000, now Pat. No. 7,000,177.

(60) Provisional application No. 60/214,781, filed on Jun. 28, 2000.

(51) Int. Cl.
*H03M 13/00* (2006.01)
*G06F 11/00* (2006.01)

(52) U.S. Cl. .................... 714/801; 714/752; 714/762; 714/788; 714/794; 714/795; 375/262; 375/341

(58) Field of Classification Search ........ 714/800–801, 714/762, 788, 794–795; 375/341, 262
See application file for complete search history.

(56) References Cited

U.S. PATENT DOCUMENTS

| 4,295,218 A | 10/1981 | Tanner |
| 4,601,044 A | 7/1986 | Kromer, III et al. |
| 5,537,444 A | 7/1996 | Nill et al. |
| 5,757,821 A | 5/1998 | Jamal et al. |
| 5,926,232 A | 7/1999 | Mangold et al. |
| 5,930,272 A | 7/1999 | Thesling |
| 5,933,462 A | 8/1999 | Viterbi et al. |
| 5,949,831 A | 9/1999 | Coker et al. |
| 5,974,540 A | 10/1999 | Morikawa et al. |
| 5,983,385 A | 11/1999 | Khayrallah et al. |
| 6,002,716 A | 12/1999 | Meyer et al. |
| 6,009,549 A | 12/1999 | Bliss et al. |
| 6,021,518 A | 2/2000 | Pelz |

(Continued)

FOREIGN PATENT DOCUMENTS

JP  2004164767  6/2004

(Continued)

OTHER PUBLICATIONS

Oberg, M., et al., "Parity Check Codes for Partial Response Channel," IEEE Global Telecommunications Conference—GLOBECOM '99, pp. 717-722, 1999.

(Continued)

*Primary Examiner*—Guy J. Lammarre P.E.

(57) ABSTRACT

A decoder for decoding data from a communication channel includes a parity check matrix including M tiers, wherein $M \geq B$, $D_{min}=B*M$ for $M=1 \ldots E$ or $B*M \geq D_{min} \geq F$ for $M>E$. $D_{min}$ is the minimum Hamming distance and $t_c=M$, wherein $t_c$ is a column weight. The parity check matrix includes no period-four cycles. B, $D_{min}$, E, F and M are integers. A soft channel decoder is configured to decode data. A soft linear block code decoder is configured to decode data decoded by the soft channel decoder in accordance with the parity check matrix.

40 Claims, 6 Drawing Sheets

U.S. PATENT DOCUMENTS

| | | | |
|---|---|---|---|
| 6,023,783 | A | 2/2000 | Divsalar et al. |
| 6,028,728 | A | 2/2000 | Reed |
| 6,081,918 | A | 6/2000 | Spielman |
| 6,145,114 | A | 11/2000 | Crozier et al. |
| 6,145,144 | A | 11/2000 | Poehlmann et al. |
| 6,161,209 | A | 12/2000 | Moher |
| 6,182,261 | B1 | 1/2001 | Haller et al. |
| 6,219,817 | B1 | 4/2001 | Holman |
| 6,427,220 | B1 | 7/2002 | Vityaev |
| 6,438,180 | B1 | 8/2002 | Kavcic et al. |
| 6,539,367 | B1 | 3/2003 | Blanksby et al. |
| 6,581,181 | B1 | 6/2003 | Sonu |
| 6,634,007 | B1 | 10/2003 | Koetter et al. |
| 6,691,263 | B2 | 2/2004 | Vasic et al. |
| 6,708,308 | B2 | 3/2004 | De Souza et al. |
| 6,715,121 | B1 | 3/2004 | Laurent |

FOREIGN PATENT DOCUMENTS

| | | |
|---|---|---|
| WO | WO 96/37050 | 11/1996 |
| WO | WO 00/19616 A2 | 4/2000 |

OTHER PUBLICATIONS

Hagenauer, Joachim, et al., "A Viterbi Algorithm with Soft-Decision Outputs and Its Application," IEEE GLOBECOM '90, pp. 1680-1686 (47.1-47.1.7) Nov. 1989.

Shoemake and Heegard, "Computationally Efficient Turbo Decoding with Bi-Directional Viterbi Algorithm (BIVA)," IEEE, ISIT 1997.

L.H.C. Lee, "Computation of the Right-Inverse of G(D) and the Left-inverse of H'(D)," Jun. 21, 1990, IEEE vol. 26, No. 13, pp. 904-906.

U.S. Appl. No. 09/901,507, filed Jul. 9, 2001, Wu, et al.

U.S. Appl. No. 09/559,186, filed Apr. 27, 2000, Nazari et al.

U.S. Appl. No. 09/730,597, filed Dec. 7, 2000, Burd et al.

U.S. Appl. No. 09/730,752, filed Dec. 7, 2000, Burd et al.

U.S. Appl. No. 09/730,603, filed Dec. 7, 2000, Wu et al.

Viterbi, Andrew J., "An Intuitive Justification and a Simplified Implementation of the MAP Decoder for Conventional Codes," IEEE Journal on Selected Areas in Communications, vol. 16, No. 2, Feb. 1995.

MacKay, David J.C., "Good Error-Correcting Codes Based on Very Sparse Matrices," IEEE Transactions on Information Theory, vol. 45, No. 2, Mar. 1999.

Gallagher, Robert G., "Low-Density Parity-Check Codes," 1963.

Wu, Zining, "Coding and Iterative Detection for Magnetic Recording Channels," The Kluwer International Series in Engineering and Computer Science.

Wu, Zining, "Coding, Iterative Detection and Timing Recovery for Magnetic Recording Channels, A Dissertation."

| 73 | Tier 1 | 73 Equations | Dmin=2 |
| 74 | Tier 2 | 74 Equations | Dmin=4 |
| 75 | Tier 3 | 75 Equations | Dmin=6 |

| | | 0............72 | 73............145 | | | | |
|---|---|---|---|---|---|---|---|
| Tier 1 | 73 Equations | 1............1 | 0............0 | | | | |
| | | 0............0 | 1............1 | | | | |
| | | 0............................................0 | | | | | |
| | | 0............................................0 | | | | | |
| | | 0............................................0 | | | | | |
| Tier 2 | 74 Equations | 1 | ——73—— | | 1 | | |
| | | | 1 | ——73—— | | 1 | |
| | | | | 1 | ——73—— | | 1 |
| | | | | | 1 | | 1 |
| | | | | | 1 | | |
| Tier 3 | 75 Equations | 1 | ——74—— | | 1 | | |
| | | | 1 | ——74—— | | 1 | |
| | | | | 1 | ——74—— | | 1 |
| | | | | | | | |
| | | | | | | | |

Fig. 5

PARITY CHECK MATRIX AND METHOD OF FORMING THEREOF

CROSS REFERENCE TO RELATED APPLICATIONS

The present application is a continuation of U.S. patent application Ser. No. 09/730,598, filed Dec. 7, 2000, now U.S. Pat. No. 7,000,177, issued Feb. 14, 2006, which claims priority under 35 U.S.C. § 119(e) to U.S. Provisional Application Ser. No. 60/214,781, entitled "Address Generator for LDPC Encoder and Decoder and Method Thereof," filed Jun. 28, 2000, the entire contents of each of which are incorporated by reference herein.

The present application is related to the following commonly-assigned, co-pending applications:

"Multi-Mode Iterative Detector", filed on Apr. 27, 2000, and assigned U.S. application Ser. No. 09/559,186, now U.S. Pat. No. 6,888,897, issued May 3, 2005, the contents of which are incorporated herein by reference;

"LDPC Encoder and Method Thereof," filed on Dec. 7, 2000, and assigned U.S. application Ser. No. 09/730,752, the entire contents of which are incorporated by reference herein;

"LDPC Decoder and Method Thereof," filed on Dec. 7, 2000, and assigned U.S. application Ser. No. 09/730,603, the entire contents of which are incorporated by reference herein; and "Address Generator for LDPC Encoder and Decoder and Method Thereof," filed on Dec. 7, 2000, and assigned U.S. application Ser. No. 09/730,597, now U.S. Pat. No. 6,965,652, issued Nov. 15, 2005, the entire contents of which are incorporated by reference herein.

BACKGROUND

1. Field of the Invention

The present invention relates generally to a parity check matrix for a linear block encoder and decoder in a data transmission system. More particularly, the present invention relates to a parity check matrix and method of forming thereof for a low-density parity check code (LDPC) encoder for a write channel and decoder for a read channel in a disk drive system.

2. Background Information

FIGS. 1 and 2 illustrate data transmission systems each employing a linear block code encoder on the transmission side and a soft linear block code decoder on the receiver side. The linear block code utilized in various systems includes a low-density parity check (LDPC) code.

With either system, the parity check matrix is an important element in a low-density parity check (LDPC) code. The parity check matrix effects system performance in terms of computation efficiency, accuracy and reliability. A linear code is a set of codewords, x, satisfying the matrix equation (1)

$$H \cdot x = 0 \qquad (1)$$

where H is an M×N matrix, and x is a 1×N vector.

The parity check matrix for an LDPC encoder/decoder is sparse, that is, a small portion of the elements being one, all other elements being zero. An example of a parity check matrix is shown in equation 2 that corresponds to the factor graph shown in FIG. 3.

$$H = \begin{bmatrix} 1011 \\ 0111 \end{bmatrix} \qquad (2)$$

which defines the following parity check equations for the codeword x $$x1 + x3 + x4 = 0$$

$$x2 + x3 + x4 = 0$$

FIG. 3 is a factor graph of the parity matrix of equation 2. The factor graph contains two types of nodes the bit node (e.g., b1, b2, b3, and b4) and the check nodes (e.g., e1, e2). Each bit node corresponds to a bit in the codeword, and each check node represents a parity check equation (i.e., a row in the parity check matrix H). Hence, the factor graph for an LDPC code with an M×N parity check matrix H contains M check nodes and N bit nodes. An edge between a check node and a bit node exists if and only if the bit participates in the parity check equation represented by the check node. The factor graph shown in FIG. 3 is "bipartite" in which the nodes can be separated to two groups, namely check nodes and bit nodes. Connections are allowed only between nodes in different groups.

A cycle in a factor graph refers to a finite set of connected edges that start and end at the same node. The bold lines in FIG. 3 represent a cycle length of four. As can be appreciated by one of ordinary skill in the art, four is the shortest cycle length a parity check matrix can have. The inventors have observed that the existence of period-4 cycles causes degradation in performance of sum-product decoding algorithms. The sum-product algorithm is discussed by Zining Wu in *Coding and Iterative Detection For Magnetic Recording Channels,* 2000, Kluwer Academic Publishers, pages 55–60, the contents of which are incorporated by reference herein.

One example of a conventional parity check is the simple parity check (SPC) matrix. The simple parity check matrix is shown in Öberg, Mats and Siegel, Paul, *Parity Check codes For Partial Response Channels,* I.E.E.E. Global Telecommunications Conference—Globalcom '99, pages 717–722, 1999, the contents of which are incorporated by reference herein.

The SPC matrix is defined by two parameters, N and M, denoting the coded block length and the number of check equations, respectively. An example of an SPC matrix is shown in equation 4.

$$SPC(N, M) = \begin{bmatrix} 11 \ldots 100 \ldots 0 \\ 00 \ldots 011 \ldots 100 \ldots 0 \\ \ldots \\ \ldots \\ 0 \ldots 11 \ldots 1 \\ N \end{bmatrix} M. \qquad (4)$$

The factor graph corresponding to this parity check matrix does not contain any cycles. This matrix also has a column weight $t_c=1$. Column weight $t_c$ refers to the number of "1"s in each column. Since the complexity of the sum-product decoding algorithm increases linearly with $t_c$, it is desirable to have a small $t_c$. The minimum Hamming distance $D_{min}=2$ for the SPC matrix of equation (4). The Hamming distance is the minimum number of columns that are linearly dependent in the parity check matrix. A large $D_{min}$ insures large separation between codewords, which results in a low bit error rate (BER). However, the coding gain of the SPC matrix of equation (4) is limited since $D_{min}=2$. The code rate for the SPC matrix is 1−M/N.

Another conventional example of a parity check matrix is the interleaved parity check matrix in which additional parity check equations are added to the SPC matrix in an interleaved way to increase the $D_{min}$. As shown in equation 5, an IPC matrix consists of two parts, the top part which is similar to an SPC matrix and the bottom part in which each row has the same number of "1"s. The IPC matrix can be specified by one parameter P, which is the number of "1"s in each row. This matrix has a dimension of $2P \times P^2$. The coded block length is $P^2$ and the number of parity check equations are 2P.

$$IPC(3) = \begin{bmatrix} 111000000 \\ 000111000 \\ 000000111 \\ \hline 100100100 \\ 010010010 \\ 001001001 \end{bmatrix} \quad (5)$$

The IPC matrix does not contain any period-4 cycles, has a $D_{min}=4$ and $t_c=2$. As is understood by one of ordinary skill in the art, there are only 2P−1 independent rows in the parity check matrix. The code rate for the IPC matrix is $(P^2-2P+1)/P^2$.

One construction of a $D_{min}=6$ parity check matrix is shown in equation 6. Its basis is an IPC matrix having P as an even number. It has a dimension of $(3P-1) \times P(P-1)$.

$$(4) = \begin{bmatrix} 111100000000 \\ 000011110000 \\ 000000001111 \\ 100010001000 \\ 010001000100 \\ 001000100010 \\ 000100010001 \\ \hline 100001000010 \\ 010000100001 \\ 001000010000 \\ 000100001000 \end{bmatrix} IPC \quad (6)$$

The upper part contains 2P−1 rows and the bottom part contains P rows where the "1"s are arranged diagonally with a shift of one column between each block. To obtain a Hamming distance of 6, then P−1, P and P+1 are relatively prime to each other. This matrix has a $D_{min}=6$, there is no period-four cycle, $t_c=3-(1/(P+1))$ or =3, and a code rate of $(P^2-4P+2)/(P^2-P)$.

SUMMARY OF THE INVENTION

According to a first aspect of the invention, a data transmission system is provided for transmitting user data to and receiving data from a communication channel. The data transmission system comprises a parity check matrix having M tiers, wherein $M \geq 2$, $D_{min}=2*M$ for M=1 . . . 3 or $2*M \geq D_{min} \geq 6$ for M>3, wherein $D_{min}$ is the minimum Hamming distance, $t_c=M$, wherein $t_c$ is the column weight, and cycle-4=0. A linear block encoder encodes the user data in response to the parity check matrix, and a transmitter transmits an output of the linear block encoder to the communication channel. A soft channel decoder decodes data, and a soft linear block code decoder to decode data decoded by the soft channel decoder in response to the parity check matrix.

According to a second aspect of the present invention, a parity check matrix is provided for one of a low-density parity check encoder and a low-density parity check decoder. The parity check matrix comprises M tiers, wherein $M \geq 2$, $D_{min}=2*M$ for M=1 . . . 3 or $2*M \geq D_{min} \geq 6$ for M>3, wherein $D_{min}$ is the minimum Hamming distance, $t_c=M$, wherein $t_c$ is the column weight, and cycle-4=0.

According to a third aspect of the present invention, each of the M tiers comprises an identity matrix having a corresponding rank $P_i$, wherein $1 \leq i \leq M$.

According to a fourth aspect of the present invention, the rank of the identity matrix of one of the tiers is mutually prime with respect to the rank of the identity matrix of another one of the tiers.

According to a fifth aspect of the present invention, the M tiers are arranged in increasing rank order.

According to a sixth aspect of the present invention, the parity check matrix comprises C columns, wherein $C \leq (P_1 * P_2)$.

According to a seventh aspect of the present invention, the parity check matrix comprises R rows, wherein $$R = \sum_{i=1}^{M} P_i.$$

According to an eighth aspect of the present invention, the parity check matrix comprises $$\sum_{i=1}^{M} P_i - (M-1)$$

independent rows.

According to a ninth aspect of the present invention, the parity check matrix comprises $$\sum_{i=1}^{M} P_i - (M-1)$$

parity bits.

According to a tenth aspect of the present invention, the parity check matrix comprises $$P_1 \times P_2 - \sum_{i=1}^{M} P_i + (M-1)$$

maximum user bits.

According to an eleventh third aspect of the present invention, for each element $A_{r,c}$, for row r and column c:

For $\sum_{j=1}^{n-1} P_j + 1 \leq r \leq \sum_{j=1}^{n} P_j$, $$A_{r,c} = \begin{cases} 1, \text{ if } c\text{mod}(P_n) = r - \sum_{j=1}^{n-1} P_j \\ 0, \text{ otherwise} \end{cases}$$

$0 \leq c \leq C$ $C \leq P_1 * P_2$

According to a twelfth aspect of the present invention, M=3, the number of rows=$P_1+P_2+P_3$, the number of columns=$P_1*P_2$, $D_{min}$=6, and $t_c$=3.

According to a thirteenth aspect of the present invention, a code rate=$(P_1*P_2+P_1-P_2-P_3+2)/(P_1*P_2)$.

According to a fourteenth aspect of the present invention, a data transmission system is provided for transmitting user data to and receiving data from a communication channel, comprising a parity check matrix having M tiers, M≧2, $D_{min}$=2*M for M=1 . . . 3 or 2*M≧$D_{min}$≧6 for M>3, wherein $D_{min}$ is the minimum Hamming distance, $t_c$=M, wherein $t_c$ is the column weight, and cycle−4=0. Linear block encoding means encodes the user data in response to the parity check matrix. Transmitting means transmits an output of the linear block encoding means to the communication channel, and soft channel decoding means decodes data. Soft linear block code decoding means decodes data decoded by the soft channel decoding means in response to the parity check matrix.

According to a fifteenth aspect of the present invention, a method is provided for transmitting data to and receiving data from a communication channel, comprising the steps of:
(a) generating a parity check matrix comprising:
  M tiers, wherein M≧2,
  $D_{min}$=2*M for M=1 . . . 3 or 2*M≧$D_{min}$≧6 for M>3, wherein $D_{min}$ is the minimum Hamming distance,
  $t_c$=M, wherein $t_c$ is the column weight, and cycle−4=0;
(b) linear block encoding the data in accordance with the parity check matrix generated in step (a);
(c) transmitting the data encoded in step (b) to the communication channel;
(d) receiving the data from to the communication channel;
(e) soft channel decoding the data read in step (d) in accordance with data decoded in step (g);
(f) generating an address in accordance with the data soft linear block code decoding the data decoded in step (e); and
(g) soft linear block code decoding data decoded by in step (e) in accordance with the address generated in step(f).

According to a sixteenth aspect of the present invention, a computer program embodied in a medium is provided for transmitting data to and receiving data from a communication channel, comprising the steps of:
(a) generating a parity check matrix comprising:
  M tiers, wherein M≧2,
  $D_{min}$=2*M for M=1 . . . 3 or 2*M≧$D_{min}$≧6 for M>3, wherein $D_{min}$ is the minimum Hamming distance,
  $t_c$=M, wherein $t_c$ is the column weight, and cycle−4=0;
(b) linear block encoding the data in accordance with the parity check matrix generated in step (a);
(c) transmitting the data encoded in step (b) to the communication channel;
(d) receiving the data from to the communication channel;
(e) soft channel decoding the data read in step (d) in accordance with data decoded in step (g);
(f) generating an address in accordance with the data soft linear block code decoding the data decoded in step (e); and
(g) soft linear block code decoding data decoded by in step (e) in accordance with the address generated in step(f).

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 4 is an example of a parity check matrix in accordance with the present invention.
FIG. 5 is another example of a parity check matrix in accordance with the present invention.

DETAILED DESCRIPTION OF THE PREFERRED EMBODIMENTS

Figure 1:
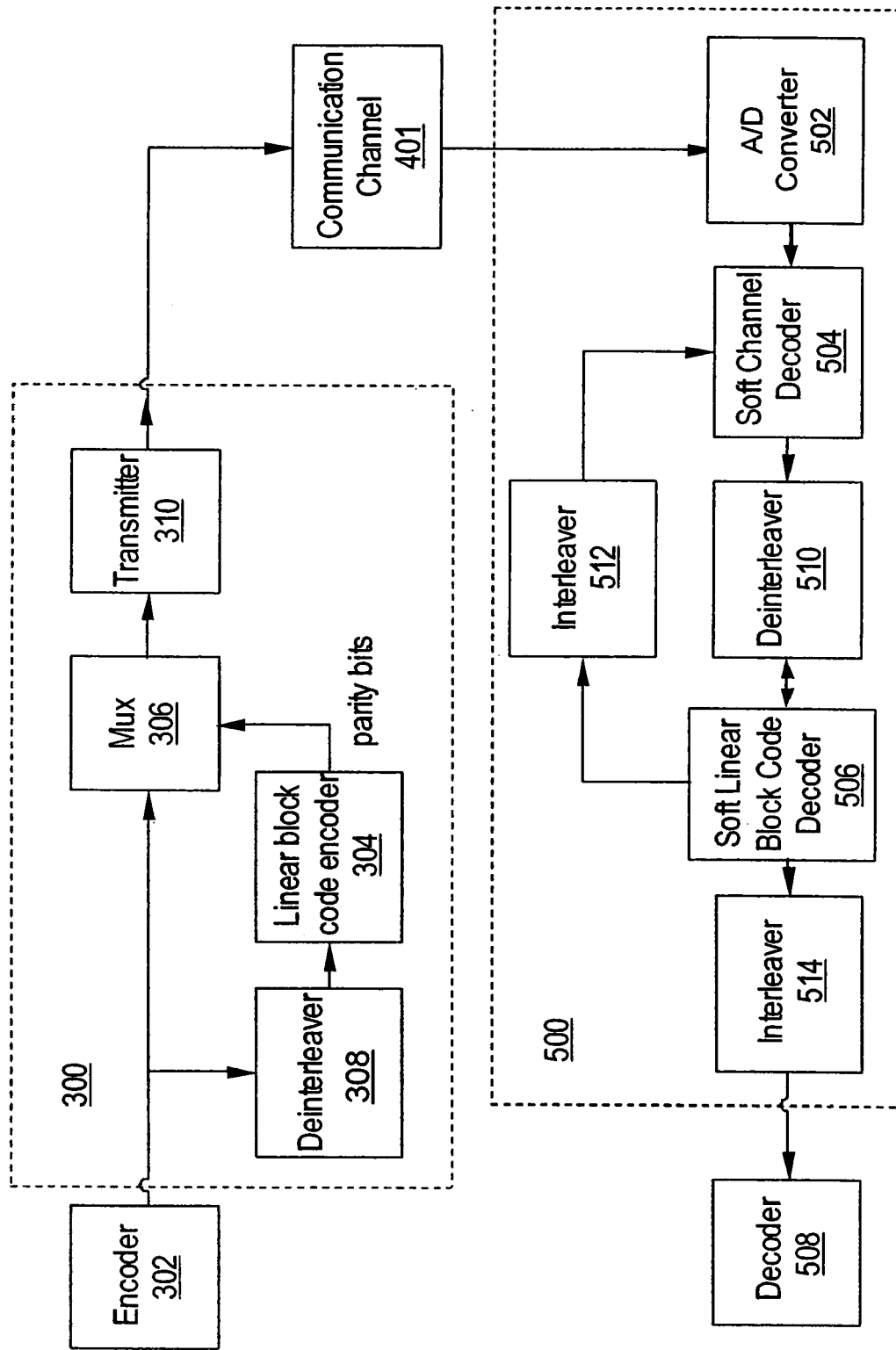
FIG. 1 is a block diagram of a data transmission system.
Figure 1A:
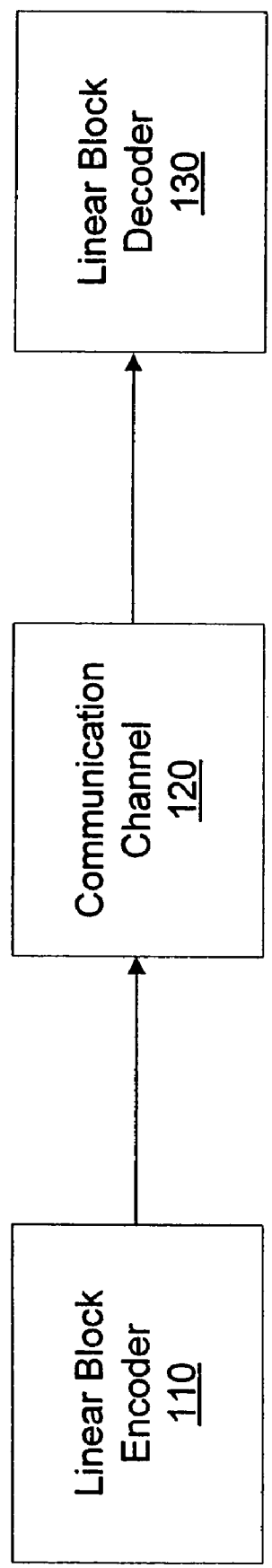
FIG. 1A is a block diagram of a generalized data transmission system.

FIG. 1A is a block diagram of a generalized data transmission system. The generalized data transmission system comprises a linear block code encoder 110, a communication channel 120 and a linear block code decoder 130. The operation of the generalized data transmission system will now be discussed. Input data is encoded by linear block code encoder 110, which generates parity data in a known manner utilizing linear block codes. One example of a linear block code is a low-density parity check (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the entire contents of each of which are incorporated by reference herein. The data is then transmitted over communication channel 120. The data from communication channel 120 is then decoded by linear block code decoder 130 in a known manner.

Referring now to FIG. 1, which illustrates a more detailed conventional digital data transmission system. As shown therein, a digital data transmission system comprises a transmitting section 300 for transmitting user data to receiver 500 via communication channel 401.

The operation of transmission section 300 will now be explained. Prior to processing by transmitting section 300, input or user data maybe encoded with an error correcting code, such as the Reed/Solomon code, or run length limited code (RLL) or a combination thereof by encoder 302. The encoded output by encoder 302 is then deinterleaved by deinterleaver 308 for input to linear block code encoder 304 which generates parity data in a known manner utilizing linear block codes. Deinterleaver 308 permutes the data so that the same data is reordered before encoding by linear block code encoder 304. By permuting or redistributing the data, deinterleaver 308 attempts to reduce the number of nearest neighbors of small distance error events, when the channel contains intersymbol interference. User data at the output of encoder 302 is referred to as being in the channel domain; that is the order in which data is transmitted through the channel. The order of data processed by deinterleaver 308 is referred to as being in the linear block code domain. The parity data from linear block code encoder 304 is combined with the data encoded by encoder 302 by multiplexer 306 for input to channel transmitter 310.

Transmitter 310 transmits the combined user and parity data from multiplexer 306 typically as an analog signal over communication channel 401 in the channel domain. Communication channel 401 may include any wireless, wire, optical and the like communication medium. Receiver 500 comprises an analog to digital converter 502 to convert the data transmitted on communication channel 401 to a digital signal. The digital signal is input to soft channel decoder 504, which provides probability information of the detected data. Soft channel decoder 504 may be implemented by a soft Viterbi detector or the like. The output of the soft channel decoder 504, which is in the channel domain, is converted into the linear block code domain by deinterleaver 510. Deinterleaver 510 is constructed similarly to deinterleaver 308. Soft linear block code decoder 506 utilizes this information and the parity bits to decode the received data. One output of soft linear block code decoder 506 is fed back to soft channel decoder 504 via interleaver 512, which converts data in the linear block code domain to the channel domain. Interleaver 512 is constructed to perform the reverse operations of deinterleaver 510. Soft channel decoder 504 and soft linear block code decoder 506 operate in an iterative manner to decode the detected data.

The other output of soft linear block code decoder 506 is converted from the linear block domain to the channel domain by interleaver 514. Interleaver 514 is constructed similarly to interleaver 512. The output of interleaver 514 is passed on for further processing to decoder 508. Decoder 508 is implemented to perform the reverse operations of encoder 302 or correct for any errors in the received data.

Figure 2:
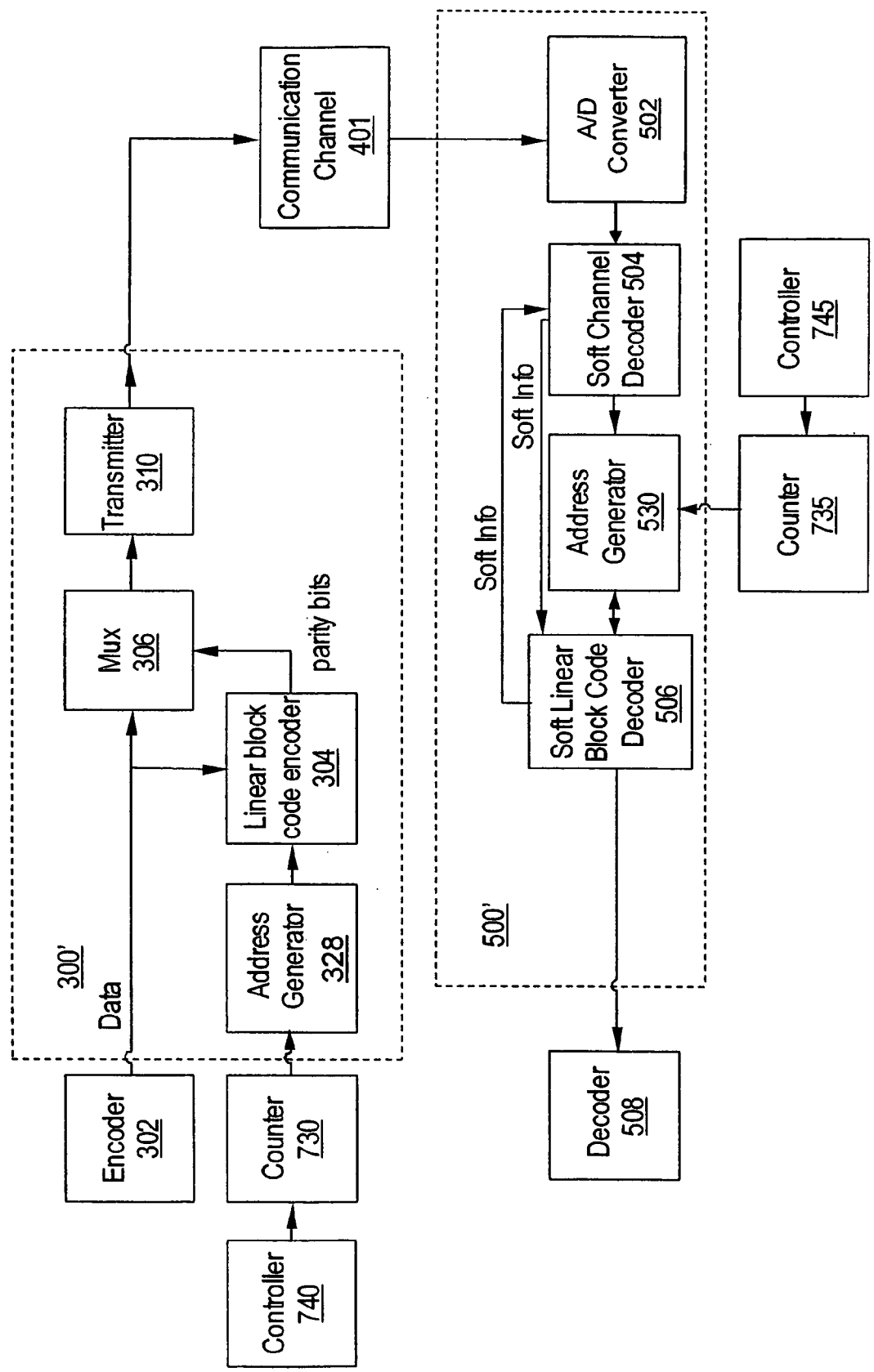
FIG. 2 is a block diagram of an alternate data transmission system.
Figure 3:
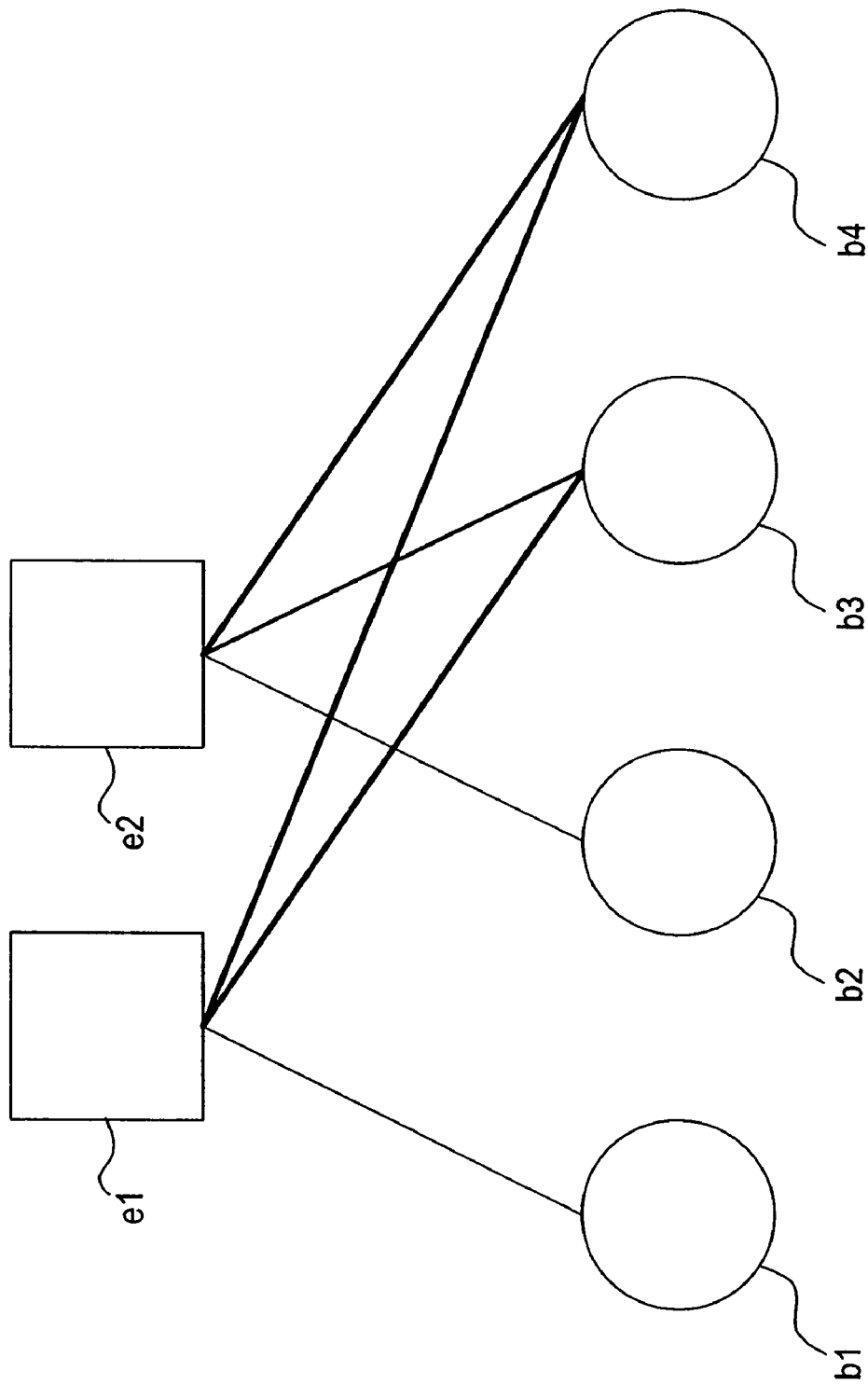
FIG. 3 is an example of a factor graph.

An alternative to incorporating deinterleaver 308 in transmission section 300 and deinterleaver 510 and interleavers 512 and 514 in receiving section 500 is to utilize an address generator to provide an address of the appropriate equation of the linear block code encoder. The address generator is described in "Address Generator for LDPC Encoder and Decoder and Method Thereof" filed on Dec. 7, 2000, and assigned U.S. application Ser. No. 09/730,597, the entire contents of which are incorporated by reference herein. As discussed therein the linear block code encoder is not dependent on a position of a bit interleaved. Rather the linear block code encoder only requires a list of equations for a given bit. In other words, there is no need to process the data in the order defined by the deinterleaver, instead data may be processed in the same order as it is written to the channel. This can be accomplished by incorporating an address generator to provide an address of the appropriate equation of the linear block code encoder. This principle can be similarly applied to the soft linear block decoder. As a result, and as illustrated in FIG. 2, deinterleaver 308 of the conventional system is now replaced by address generator 328, and deinterleaver 510 is now replaced by address generator 530. Accordingly, there is no requirement for the physical interleaving of data in the receiver 500' illustrated in FIG. 2, since the data remains in the same order as the order of bits of data in the channel throughout this system. The order of bits of data transmitted through the channel is referred to as the channel domain.

The linear block code encoder in FIGS. 1, 1A and 2 utilize a parity check matrix to generate the parity data. The parity check matrix in a low-density parity check code, in accordance with the present invention, comprises no period-4 cycles. Period 4 cycles cause degradation in performance of the sum-product algorithm. Additionally, the parity check matrix comprises a large $D_{min}$ or minimum Hamming distance of the code. This refers to the minimum number of columns that are linearly dependent in the parity check matrix. A large $D_{min}$ insures separation between codewords to provide a low bit error rate. Another parameter $t_c$ is the number of "1"s in each column of the parity check matrix. Since the complexity of the sum-product decoding algorithm increases linearly with $t_c$, the parity check matrix preferably has a small $t_c$.

The parity check matrix in accordance with the present invention is shown in equation 7.

$$\begin{bmatrix} I_{p1,1} I_{P1,2} \ldots ; I_{P1,r} \\ I_{p2,1} I_{P2,2} \ldots ; I_{P2,r} * \\ I_{p3,1} I_{P3,2} \ldots ; I_{P3,r} * \\ \ldots \\ I_{pM,1} I_{PM,2} \ldots ; I_{PM,r} * \end{bmatrix} \quad (7)$$

In equation 7, $I_{pi}$ denotes a $P_i \times P_i$ (rank $P_i$) identity matrix for i=1 to M. Equation 8 shows an identity matrix with a rank of 4.

$$\begin{bmatrix} 1000 \\ 0100 \\ 0010 \\ 0001 \end{bmatrix} \quad (8)$$

The parity matrix can be generalized as comprising M tiers (M≧2), each tier i comprising a row of identity matrixes $I_{pi}$ of rank $P_i$. The matrix is arranged such that $P_1 < \ldots < P_i < \ldots < P_M$ and $P_1$, $P_i$, $P_M$ are mutually prime. The number of columns in the preferred matrix is less than or equal to ($P_1 \times P_2$). As can be readily seen, for tiers greater than 2, the last matrix in each row is not complete. Equation 8A is illustrative of a partial identity matrix of rank 3.

$$\begin{bmatrix} 100 \\ 010 \\ 001 \\ 000 \end{bmatrix} \quad (8A)$$

More specifically, each element $A_{r,c}$, for row r and column c, is as follows:

$$\text{For } \sum_{j=1}^{n-1} P_j + 1 \leq r \leq \sum_{j=1}^{n} P_j,$$

$$A_{r,c} = \begin{cases} 1, \text{ if } c \bmod(P_n) = r - \sum_{j=1}^{n-1} P_j \\ 0, \text{ otherwise} \end{cases}$$

$$0 \leq c \leq C$$

$$C \leq P_1 * P_2$$

The parity matrix in accordance with the preferred embodiment of the present invention comprises a total of $$\sum_{i=1}^{M} P_i$$

rows in the matrix, of which $$\sum_{i=1}^{M} P_i - (M-1)$$

rows are independent. Thus, the total number of parity bits is $$\sum_{i=1}^{M} P_i - (M-1),$$

and the maximum number of user bits is $$P_1 \times P_2 - \sum_{i=1}^{M} P_i + (M-1).$$

To accommodate a smaller sector size, the columns of the parity check matrix can be truncated. As such, the number of user bits are reduced, while the number of parity bits and $D_{min}$ remain the same. The preferred matrix in accordance with present invention comprises M tiers, $D_{min}=2M$ for $M=1\ldots 3$ or $2*M \geq D_{min} \geq 6$ for $M>3$, $t_c=M$ and cycle-4=0.

For M=3, the matrix has a dimension of $(P_1+P_2+P_3) \times (P_1*P_2)$, $D_{min}=6$ and $t_c=3$. The code rate for the matrix= $(P_1*P_2-P_1-P2-P3+2)/(P_1*P_2)$.

Reference is now made to FIG. 4, which shows a parity check matrix in accordance with the preferred embodiment of the present invention. The parity check matrix comprises 222 rows (or equations) by 5402 columns, which comprises 220 linearly independent rows (where 5402=73*74). The matrix can be divided into three tiers of equations having 73, 74 and 75 equations, respectively. As can be seen the tiers (73, 74 and 75) are mutually prime. The set of independent rows can be obtained by canceling the last row of the second tier and third tier, namely the 147$^{th}$ row and the 222$^{nd}$ row. The following table shows the values of the elements in the matrix:

| Tier | i$^{th}$ position | i$^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75) | where r is the index within a tier.

where r is the index within a tier.

A matrix having 5402 columns can process a maximum LDPC codeword of 5402 bits. Of course, as will be appreciated by one of ordinary skill in the art, the matrix may be truncated to accommodate a smaller block. However, the matrix must be at least 222×4366. (The minimum size is dependent on the RLL encoding.) The preferred matrix contains no cycles, since a matrix having cycles has degraded performance that degrades exponentially. The $D_{min}$ can be determined as follows. With the first tier only, the parity check matrix has a $D_{min}=2$; by adding the second tier, the parity check matrix has a $D_{min}=4$; and by adding the third tier, the parity check matrix has a $D_{min}=6$. This matrix does not contain any period-4 cycles.

Reference is now made to FIG. 5, which shows an alternate parity check matrix in accordance with the preferred embodiment of the present invention. Similar to the previous parity check matrix, this parity check matrix comprises 222 rows (or equations) by 5402 columns, which comprises 220 linearly independent rows (where 5402=73*74). The matrix can be divided into three tiers of equations having 73, 74 and 75 equations, respectively. As can be seen the tiers (73, 74 and 75) are mutually prime. The set of independent rows can be obtained by canceling the last row of the second tier and third tier, namely the 147$^{th}$ row and the 222$^{nd}$ row. The following table shows the values of the elements in the matrix:

| Tier | i$^{th}$ position | i$^{th}$ position |
|---|---|---|
| 1 | 1 if r = floor (i/73) | 0 if r ≠ floor (i/73) |
| 2 | 1 if r = i(mod74) | 0 if r ≠ i(mod74) |
| 3 | 1 if r = i(mod75) | 0 if r ≠ i(mod75) | where r is the index within a tier.

where r is the index within a tier.

While the invention has been described in conjunction with several specific embodiments, it is evident to those skilled in the art that many further alternatives, modifications and variations will be apparent in light of the foregoing description. More specifically, it is apparent that various matrix manipulations may be performed on the preferred matrix, which results in an equivalent. Such manipulated matrix falls with spirit and scope of the claims. While the present invention maybe implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A decoder for decoding data from a communication channel, comprising:
  a parity check matrix comprising:
   M tiers,
    wherein M≧B;
   $D_{min}=B*M$ for M=1 . . . E or
    $B*M \geq D_{min} \geq F$ for M>E,
     wherein $D_{min}$ comprises a minimum Hamming distance; and
   $t_c=M$,
    wherein $t_c$ comprises a column weight,
    wherein the parity check matrix comprises no period-four cycles, and
    wherein B, $D_{min}$, E, F and M comprise integers;
  a soft channel decoder configured to decode data; and
  a soft linear block code decoder configured to decode data decoded by the soft channel decoder in accordance with the parity check matrix.

2. The decoder of claim 1, wherein each of the M tiers comprises an identity matrix having a corresponding rank $P_i$, wherein $1 \leq i \leq M$.

3. The decoder of claim 2, wherein the rank of the identity matrix of one of the tiers is mutually prime with respect to the rank of the identity matrix of another one of the tiers.

4. The decoder of claim 2, wherein the M tiers are arranged in increasing rank order.

5. The decoder of claim 4, wherein the parity check matrix comprises C columns, wherein $C \leq (P_1 * P_2)$.

6. The decoder of claim 4, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, \text{ if } c\bmod(P_n) = r - \sum_{j=1}^{n-1} P_j \\ 0, \text{ otherwise} \end{cases}$$

$$0 \leq c \leq C$$

$$C \leq P_1 * P_2.$$

7. The decoder of claim 2, wherein the parity check matrix comprises R rows, wherein $$R = \sum_{i=1}^{M} P_i.$$

8. The decoder of claim 7, wherein the parity check matrix comprises $$\sum_{i=1}^{M} P_i - (M-1)$$

independent rows.

9. The decoder of claim 2, wherein the parity check matrix comprises $$\sum_{i=1}^{M} P_i - (M-1)$$

parity bits.

10. The decoder of claim 2, wherein the parity check matrix comprises $$P_1 \times P_2 - \sum_{i=1}^{M} P_i + (M-1)$$

maximum user bits.

11. An encoder for encoding data from a communication channel, comprising:
  a parity check matrix comprising:
   M tiers,
    wherein M≧B;
   $D_{min}=B*M$ for M=1 . . . E or
    $B*M \geq D_{min} \geq F$ for M>E,
     wherein $D_{min}$ comprises a minimum Hamming distance;
   $t_c=M$,
    wherein $t_c$ comprises a column weight,
    wherein the parity check matrix comprises no period-four cycles, and
    wherein B, $D_{min}$, E, F and M comprise integers;
  a linear block encoder configured to encode the user data in response the parity check matrix; and
  a transmitter configured to transmit an output of the linear block encoder to the communication channel.

12. The encoder of claim 11, wherein each of the M tiers comprises an identity matrix having a corresponding rank $P_i$, wherein $1 \leq i \leq M$.

13. The encoder of claim 12, wherein the rank of the identity matrix of one of the tiers is mutually prime with respect to the rank of the identity matrix of another one of the tiers.

14. The encoder of claim 12, wherein the M tiers are arranged in increasing rank order.

15. The encoder of claim 14, wherein the parity check matrix comprises C columns, wherein $C \leq (P_1 * P_2)$.

16. The encoder of claim 14, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, \text{ if } c\bmod(P_n) = r - \sum_{j=1}^{n-1} P_j \\ 0, \text{ otherwise} \end{cases}$$

$$0 \leq c \leq C$$

$$C \leq P_1 * P_2.$$

17. The encoder of claim 12, wherein the parity check matrix comprises R rows, wherein $$R = \sum_{i=1}^{M} P_i.$$

18. The encoder of claim 16, wherein the parity check matrix comprises $$\sum_{i=1}^{M} P_i - (M-1)$$

independent rows.

19. The encoder of claim 12, wherein the parity check matrix comprises $$\sum_{i=1}^{M} P_i - (M-1)$$

parity bits.

20. The encoder of claim 12, wherein the parity check matrix comprises $$P_1 \times P_2 - \sum_{i=1}^{M} P_i + (M-1)$$

maximum user bits.

21. A method for decoding data received from a communication channel, comprising the steps of:
(a) soft channel decoding the data received from the communication channel in accordance with data decoded in step (c);
(b) generating a parity check matrix comprising:
  M tiers,
    wherein M≧B;
  $D_{min}$=B*M for M=1 . . . E or
  B*M≧$D_{min}$≧F for M>E,
    wherein $D_{min}$ comprises a minimum Hamming distance; and
  $t_c$=M,
    wherein $t_c$ comprises a column weight,
    wherein the parity check matrix comprises no period-four cycles, and
    wherein B, $D_{min}$, E, F and M comprise integers; and
(c) soft linear block code decoding data decoded in step (a) in accordance with the parity check matrix generated in step(b).

22. The method of claim 21, wherein each of the M tiers comprises an identity matrix having a corresponding rank $P_i$, wherein 1≦i≦M.

23. The method of claim 22, wherein the rank of the identity matrix of one of the tiers is mutually prime with respect to the rank of the identity matrix of another one of the tiers.

24. The method of claim 22, wherein the M tiers are arranged in increasing rank order.

25. The method of claim 24, wherein the parity check matrix comprises C columns, wherein C≦($P_1$*$P_2$).

26. The method of claim 24, wherein for each element $A_{r,c}$ $$\text{For } \sum_{j=1}^{n-1} P_j + 1 \le r \le \sum_{j=1}^{n} P_j,$$

$$A_{r,c} = \begin{cases} 1, \text{ if } c\bmod(P_n) = r - \sum_{j=1}^{n-1} P_j \\ 0, \text{ otherwise} \end{cases}$$

$$0 \le c \le C$$

$$C \le P_1 * P_2.$$

27. The method of claim 22, wherein the parity check matrix comprises R rows, wherein $$R = \sum_{i=1}^{M} P_i.$$

28. The method of claim 27, wherein the parity check matrix comprises $$\sum_{i=1}^{M} P_i - (M-1)$$

independent rows.

29. The method of claim 22, wherein the parity check matrix comprises $$\sum_{i=1}^{M} P_i - (M-1)$$

parity bits.

30. The method of claim 22, wherein the parity check matrix comprises $$P_1 \times P_2 - \sum_{i=1}^{M} P_i + (M-1)$$

maximum user bits.

31. A method for encoding data transmitted to a communication channel, comprising the steps of:
(a) generating a parity check matrix comprising:
  M tiers,
    wherein M≧B,
  $D_{min}$=B*M for M=1 . . . E or
  B*M≧$D_{min}$≧F for M>E;
    wherein $D_{min}$ comprises a minimum Hamming distance;
  $t_c$=M,
    wherein $t_c$ comprises a column weight,
    wherein the parity check matrix comprises no period-four cycles, and
    wherein B, $D_{min}$, E, F and M comprise integers;
(b) linear block encoding the data in accordance with the parity check matrix generated in step (a); and (c) transmitting the data encoded in step (b) to the communication channel.

32. The method of claim 31, wherein each of the M tiers comprises an identity matrix having a corresponding rank $P_i$, wherein $1 \leq i \leq M$.

33. The method of claim 32, wherein the rank of the identity matrix of one of the tiers is mutually prime with respect to the rank of the identity matrix of another one of the tiers.

34. The method of claim 32, wherein the M tiers are arranged in increasing rank order.

35. The method of claim 34, wherein the parity check matrix comprises C columns, wherein $C \leq (P_1 * P_2)$.

36. The method of claim 34, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, \text{ if } c\bmod(P_n) = r - \sum_{j=1}^{n-1} P_j \\ 0, \text{ otherwise} \end{cases}$$

$$0 \leq c \leq C$$

$$C \leq P_1 * P_2.$$

37. The method of claim 32, wherein the parity check matrix comprises R rows, wherein $$R = \sum_{i=1}^{M} P_i.$$

38. The method of claim 37, wherein the parity check matrix comprises $$\sum_{i=1}^{M} P_i - (M-1)$$

independent rows.

39. The method of claim 32, wherein the parity check matrix comprises $$\sum_{i=1}^{M} P_i - (M-1)$$

parity bits.

40. The method of claim 32, wherein the parity check matrix comprises $$P_1 \times P_2 - \sum_{i=1}^{M} P_i + (M-1)$$

maximum user bits.

* * * * *

UNITED STATES PATENT AND TRADEMARK OFFICE
CERTIFICATE OF CORRECTION

PATENT NO. : 7,168,033 B1  Page 1 of 1
APPLICATION NO. : 11/281400
DATED : January 23, 2007
INVENTOR(S) : Zining Wu et al.

It is certified that error appears in the above-identified patent and that said Letters Patent is hereby corrected as shown below:

Column 6, Line 59:      Delete "maybe" and insert --may be--
Column 10, Line 57:     Delete "maybe" and insert --may be--
Column 10, Line 62:     Delete "obtain" and insert --obtained--
Column 12, Line 35:     Insert --to-- after "response"

Signed and Sealed this

Twenty-ninth Day of May, 2007

JON W. DUDAS
*Director of the United States Patent and Trademark Office*